(12) United States Patent
Moon et al.

(10) Patent No.: US 7,679,981 B2
(45) Date of Patent: *Mar. 16, 2010

(54) SEMICONDUCTOR DEVICE

(75) Inventors: Hyung Wook Moon, Seoul (KR); Ki Chang Kwean, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/409,095

(22) Filed: Mar. 23, 2009

(65) Prior Publication Data

US 2009/0185433 A1 Jul. 23, 2009

Related U.S. Application Data

(62) Division of application No. 11/533,536, filed on Sep. 20, 2006, now Pat. No. 7,529,146.

(30) Foreign Application Priority Data

Oct. 12, 2005 (KR) ................ 2005-96252

(51) Int. Cl.
*G11C 7/00* (2006.01)
(52) U.S. Cl. ............... 365/222; 365/230.03; 365/227; 365/226; 365/229
(58) Field of Classification Search ........... 365/222, 365/230.03, 227, 226, 229
See application file for complete search history.

(56) References Cited

U.S. PATENT DOCUMENTS

| 5,265,231 | A | 11/1993 | Nuwayser | 711/106 |
|---|---|---|---|---|
| 6,404,680 | B1 | 6/2002 | Kwon | 365/185.3 |
| 6,545,941 | B2 | 4/2003 | Kato et al. | 365/233 |
| 6,822,924 | B2 | 11/2004 | Lee | 365/233 |
| 7,042,794 | B2 | 5/2006 | Kim | 365/230 |
| 7,082,074 | B2 * | 7/2006 | Horiguchi et al. | 365/226 |
| 2004/0125679 | A1 | 7/2004 | Kwean | 365/222 |
| 2006/0133168 | A1 | 6/2006 | Kwack et al. | 365/203 |

FOREIGN PATENT DOCUMENTS

JP  2004-327008  11/2004

* cited by examiner

*Primary Examiner*—Hoai V Ho
*Assistant Examiner*—Fernando N Hidalgo
(74) *Attorney, Agent, or Firm*—Marshall, Gerstein & Borun LLP

(57) ABSTRACT

A semiconductor device may include a first logic unit for performing a logic operation with respect to a plurality of first control signals, each of which indicates whether a corresponding one of a plurality of banks of the semiconductor device is in an active state, a refresh detector for outputting a second control signal which is enabled when at least one of the banks performs a self-refresh operation or auto-refresh operation, and a second logic unit for performing a logic operation with respect to an output signal from the first logic unit and the second control signal to generate a third control signal having information about activation of the semiconductor device. The third control signal is enabled when at least one of the banks performs the self-refresh operation or auto-refresh operation even though it is in the active state.

19 Claims, 5 Drawing Sheets

SEMICONDUCTOR DEVICE

CROSS-REFERENCE TO RELATED APPLICATIONS

This is a divisional application which is based on and claims priority to commonly-assigned U.S. patent application Ser. No. 11/533,536, entitled "Semiconductor Device," which was filed Sep. 20, 2006, and which in turn claims convention priority of Korean application 2005-96252 filed Oct. 12, 2005, the entire disclosures of which are expressly incorporated by reference herein.

TECHNICAL FIELD

This patent relates to a semiconductor device, and more particularly to a semiconductor device wherein, when a refresh operation is performed even though the semiconductor device is in an active mode, a RAS idle signal is enabled, thereby reducing unnecessary current consumption of the semiconductor device.

DESCRIPTION OF THE RELATED ART

Generally, in a semiconductor device such as a dynamic random access memory (DRAM), when a row active signal is enabled high in level, a RAS idle signal becomes low in level to indicate that the semiconductor device has entered an active state. Here, the row active signal is enabled while the word line of a corresponding bank is enabled, to indicate that the corresponding bank is in the active state. The RAS idle signal is made active in a RAS standby state. This RAS idle signal has information about whether the semiconductor device such as the DRAM is in an active mode, and is enabled when all banks are idle.

When the row active signal is enabled high in level and the RAS idle signal goes low in level, the semiconductor device enters a kind of command wait state under control of the RAS idle signal to perform a read, write or precharge operation. However, conventionally, when an auto-refresh or self-refresh command is inputted, the RAS idle signal is disabled low in level due to only the fact that an auto-refresh or self-refresh operation is an operation in the active state where the row active signal is enabled high in level, in spite of the fact that the auto-refresh or self-refresh operation is not an actual operation, such as the read operation, write operation or precharge operation. As a result, the semiconductor device enters a kind of command wait state, resulting in unnecessary consumption of current therein.

Figure 1:
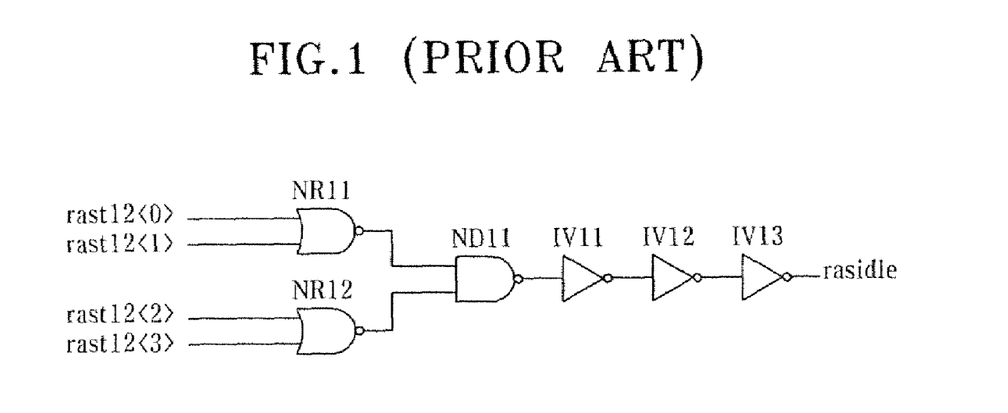
FIG. 1 is a circuit diagram showing the configuration of a conventional semiconductor device that generates a RAS idle signal.

FIG. 1 shows the configuration of a conventional semiconductor device that generates a RAS idle signal. As shown in FIG. 1, the conventional semiconductor device is adapted to receive row active signals rast12<0> to rast12<3>, each of which indicates whether a corresponding one of a plurality of banks is in an active state, and perform a logic operation with respect to the received row active signals rast12<0> to rast12<3> to generate a RAS idle signal rasidle. In FIG. 1, if at least one of the banks enters the active state, at least one of the row active signals rast12<0> to rast12<3> is enabled high in level, so an output signal from a NOR gate NR11 or NOR gate NR12, which is an input signal to a NAND gate ND11, becomes low in level. As a result, in response to this low-level input signal, the NAND gate ND11 outputs a high-level signal, thereby causing the RAS idle signal to become low in level.

As stated above, in the conventional semiconductor device, whether the RAS idle signal rasidle is enabled is determined according to the row active signals rast12<0> to rast12<3> which indicate whether the corresponding banks are in the active state, under the condition that no consideration is taken about whether the corresponding banks perform an auto-refresh or self-refresh operation. For this reason, in the case where an auto-refresh or self-refresh command is inputted, the RAS idle signal is disabled low in level due to only the fact that the auto-refresh or self-refresh operation is an operation in the active state, in spite of the fact that the auto-refresh or self-refresh operation is not an actual operation, such as a read operation, write operation or precharge operation. As a result, the semiconductor device enters a kind of command wait state, resulting in unnecessary consumption of current therein.

SUMMARY OF THE INVENTION

A semiconductor device provides when a refresh operation is performed even though the semiconductor device is in an active mode, an enables RAS idle signal, thereby reducing unnecessary current consumption of the semiconductor device.

A semiconductor device may include a first logic unit for performing a logic operation with respect to a plurality of first control signals, each of the first control signals indicating whether a corresponding one of a plurality of banks of the semiconductor device is in an active state, a refresh detector for outputting a second control signal which is enabled when at least one of the banks performs a self-refresh operation or auto-refresh operation; and a second logic unit for performing a logic operation with respect to an output signal from the first logic unit and the second control signal to generate a third control signal, the third control signal having information about activation of the semiconductor device, wherein the third control signal is enabled when at least one of the banks performs the self-refresh operation or auto-refresh operation even though it is in the active state.

The third control signal may be a RAS idle signal.

The first logic unit may perform an OR operation with respect to the first control signals.

The first logic unit may include a plurality of NOR gates, each of the NOR gates performing a NOR operation with respect to corresponding two of the first control signals; and a NAND gate for performing a NAND operation with respect to output signals from the NOR gates.

The second logic unit may activate and output the third control signal in response to inactivation of the output signal from the first logic unit or activation of the second control signal.

The second logic unit may perform a NAND operation.

The refresh detector may include a plurality of signal generators, each of the signal generators generating a corresponding fourth control signal which is enabled when the corresponding bank performs the self-refresh operation or auto-refresh operation; and a third logic unit for performing a logic operation with respect to the fourth control signals from the signal generators to output the second control signal.

Each of the signal generators may include a pull-up driver for pulling a first node up; a pull-down driver for pulling the first node down in response to an auto-refresh signal; a first latch for latching a signal at the first node for a predetermined period; and a fourth logic unit for performing a logic operation with respect to an output signal from the first latch and a self-refresh signal to output the corresponding fourth control signal.

The first latch may be an inverting latch.

The fourth logic unit may perform a NOR operation.

Each of the signal generators may further include a buffer for buffering an initialization signal; and a logic element for performing a logic operation with respect to an output signal from the buffer and a precharge enable signal and supplying the resulting signal to a control gate of the pull-up driver.

The logic element may perform a NOR operation.

Each of the signal generators may further include a second latch for receiving the corresponding fourth control signal and a RAS activation guarantee signal, the second latch including first and second logic elements interconnected in latch form; a first buffer for buffering an output signal from the second latch; a delay for delaying an output signal from the first buffer by a predetermined delay time; and a fifth logic unit for performing a logic operation with respect to the output signal from the first buffer and an output signal from the delay to output a precharge enable signal.

The first and second logic elements of the second latch may be NAND gates.

The first buffer may be an inverting buffer.

The fifth logic unit may perform an AND operation.

Each of the signal generators may further include a second buffer for buffering an initialization signal; and a third logic element for performing a logic operation with respect to an output signal from the second buffer and the precharge enable signal and supplying the resulting signal to a control gate of the pull-up driver.

The third logic element may perform a NOR operation.

Each of the fourth control signals may be enabled low in level and the third logic unit may perform an AND operation.

The third logic unit may include a plurality of NAND gates, each of the NAND gates performing a NAND operation with respect to corresponding two of the fourth control signals; and a NOR gate for performing a NOR operation with respect to output signals from the NAND gates.

Each of the first control signals may be a row active signal.

BRIEF DESCRIPTION OF THE DRAWINGS

The features and other advantages will be more clearly understood from the following detailed description taken in conjunction with the accompanying drawings, in which.

DETAILED DESCRIPTION

Reference will now be made in detail to several exemplary embodiments, examples of which are illustrated in the accompanying drawings, wherein like reference numerals refer to like elements throughout. The embodiments are described with reference to the figures.

Figure 2:
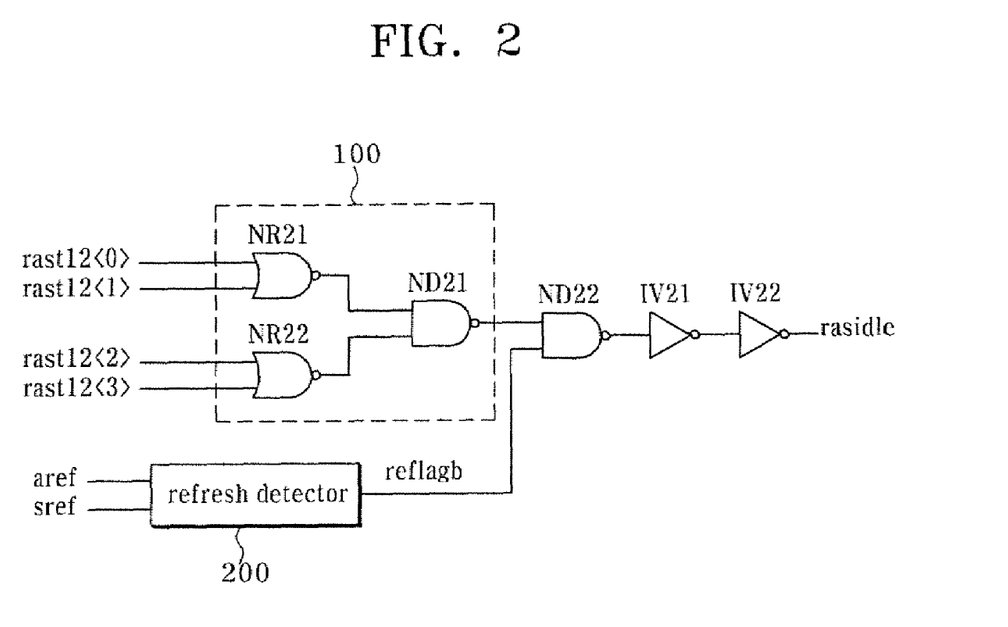
FIG. 2 is a circuit diagram showing the configuration of a semiconductor device that generates a RAS idle signal, according to an exemplary embodiment.
Figure 3:
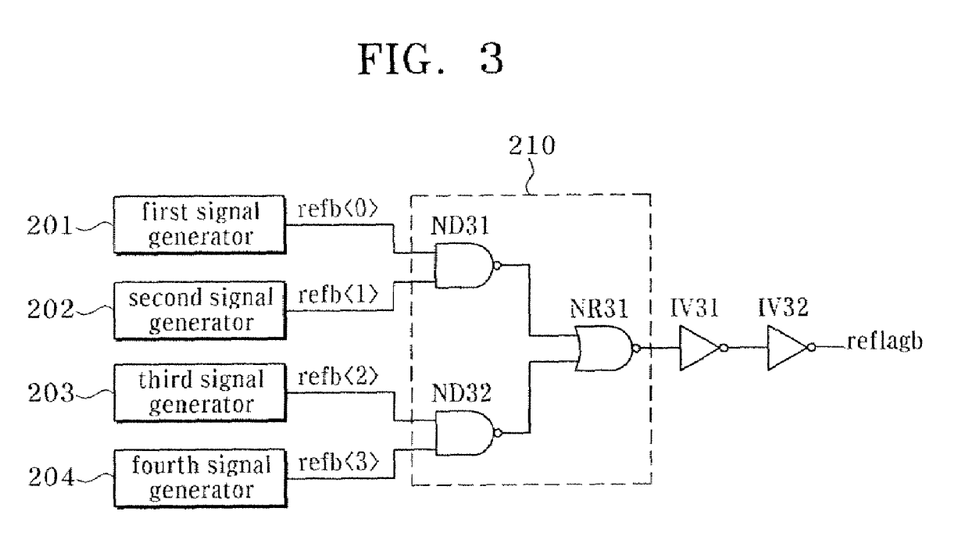
FIG. 3 is a circuit diagram of a refresh detector in the semiconductor device according to this embodiment.
Figure 4:
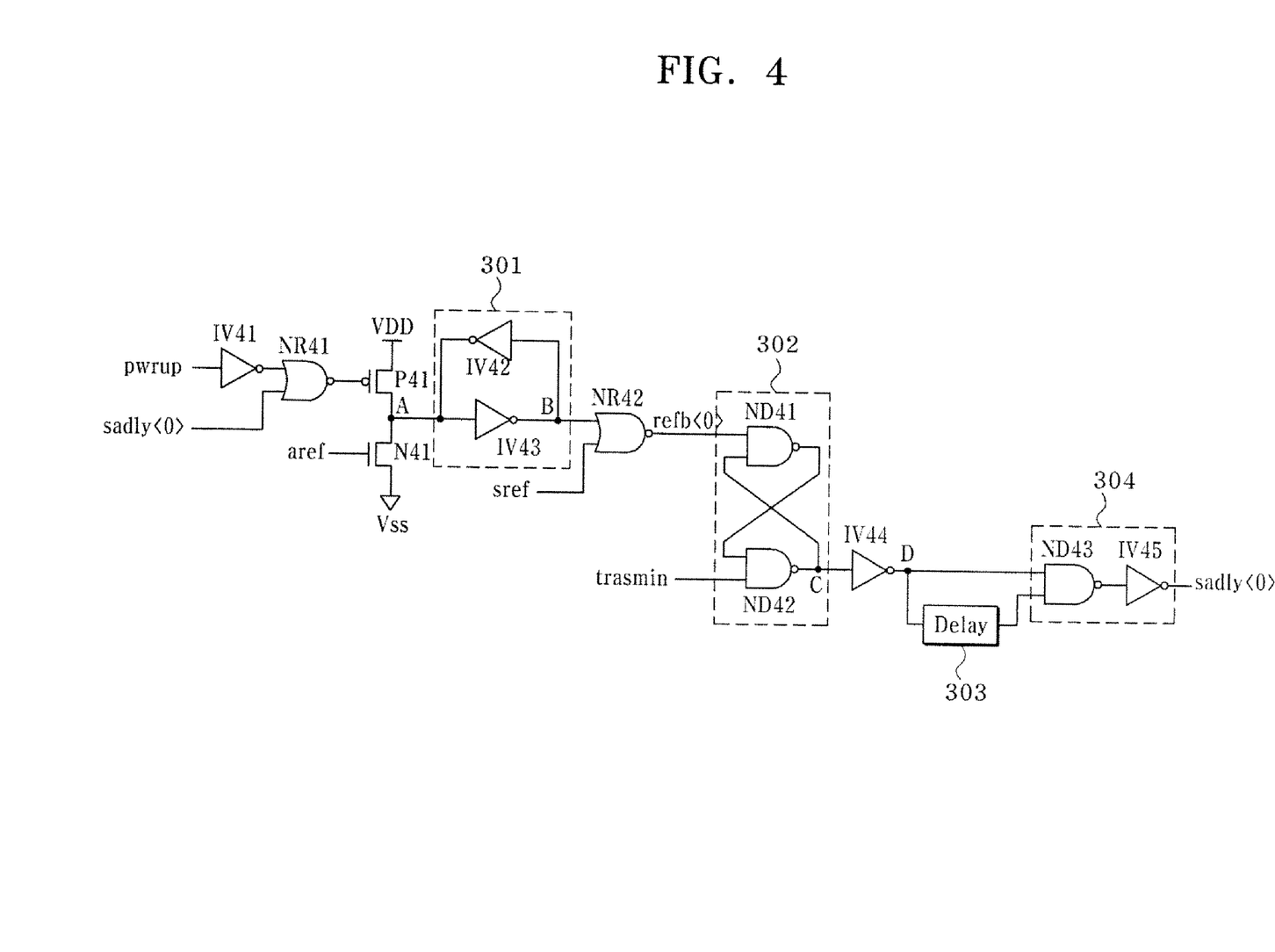
FIG. 4 is a circuit diagram of a first signal generator in the refresh detector of FIG. 3.

FIG. 2 is a circuit diagram showing the configuration of a semiconductor device that generates a RAS idle signal, according to an exemplary embodiment, FIG. 3 is a circuit diagram of a refresh detector in the semiconductor device according to this embodiment, and FIG. 4 is a circuit diagram of a first signal generator in the refresh detector of FIG. 3. The configuration of the semiconductor device according to this embodiment will hereinafter be described with reference to these figures.

As shown in FIG. 2, the semiconductor device may include a logic unit 100 for performing an OR operation with respect to a plurality of row active signals rast12<0> to rast12<3>, each of which indicates whether a corresponding one of a plurality of banks of the semiconductor device is in an active state, a refresh detector 200 for outputting a control signal reflagb which is enabled low in level when at least one of the banks performs a self-refresh operation or auto-refresh operation. and a NAND gate ND22 for performing a NAND operation with respect to an output signal from the logic unit 100 and the control signal reflagb to generate a RAS idle signal rasidle. The RAS idle signal rasidle is enabled when at least one of the banks performs the self-refresh operation or auto-refresh operation even though it is in the active state.

As shown in FIG. 3, the refresh detector 200 includes first to fourth signal generators 201 to 204 each for generating a control signal refb<0>, refb<1>, refb<2> or refb<3> which is enabled low in level when the corresponding bank performs the self-refresh operation or auto-refresh operation, and a logic unit 210 for performing an AND operation with respect to the control signals refb<0> to refb<3> from the first to fourth signal generators 201 to 204 to output the control signal reflagb.

As shown in FIG. 4, each of the first to fourth signal generators 201 to 204 includes a PMOS transistor P41 for pulling a node A up, an NMOS transistor N41 for pulling the node A down in response to an auto-refresh signal aref, and a latch 301 for latching a signal at the node A for a predetermined period, and a NOR gate NR42 for performing a NOR operation with respect to an output signal from the latch 301 and a self-refresh signal sref to output the control signal refb. Each of the first to fourth signal generators 201 to 204 further includes an inverter IV41 for inverting and buffering an initialization signal pwrup, and a NOR gate NR41 for performing the NOR operation with respect to an output signal from the inverter IV41 and a precharge enable signal sadly and supplying the resulting signal to a control gate of the PMOS transistor P41. Each of the first to fourth signal generators 201 to 204 further includes a latch 302 for receiving the control signal refb and a RAS activation guarantee signal trasmin. The latch 302 is composed of two NAND gates ND41 and ND42 interconnected in latch form. Each of the first to fourth signal generators 201 to 204 further includes an inverter IV44 for inverting and buffering an output signal from the latch 302, a delay 303 for delaying an output signal from the inverter IV44 by a predetermined delay time, and a logic unit 304 for performing the AND operation with respect to the output signal from the inverter IV44 and an output signal from the delay 303 to output the precharge enable signal sadly.

The operation of the semiconductor device with the above-stated configuration will hereinafter be described in detail with reference to FIGS. 2 to 5.

As shown in FIG. 2, the logic unit 100 ORs the row active signals Rast12<0> to rast12<3>, each of which indicates whether the corresponding bank is in the active state, and provides the ORed result to the NAND gate ND22. Here, the row active signal is enabled while the word line of the corresponding bank is enabled, to indicate that the corresponding bank is in the active state. If at least one of the banks enters the active state, at least one of the row active signals rast12<0> to rast12<3> is enabled high in level, so at least one of output signals from a NOR gate NR21 and NOR gate NR22, which are input signals to a NAND gate ND21, becomes low in level. As a result, the NAND gate ND21 receives the at least one low-level signal and thus outputs a high-level signal. Consequently, the logic unit 100 ORs the row active signals rast12<0> to rast12<3> and outputs the ORed result.

Meanwhile, the refresh detector 200 determines whether the auto-refresh operation or self-refresh operation is performed, on the basis of the auto-refresh signal aref or self-refresh signal sref, and outputs the control signal reflagb which is enabled low in level when at least one of the banks performs the self-refresh operation or auto-refresh operation. The auto-refresh signal aref is a pulse signal indicative of the auto-refresh operation, which is enabled high in level at the same time that the semiconductor device enters the auto-refresh operation, and then immediately goes low in level again. The self-refresh signal sref is a pulse signal indicative of the self-refresh operation, which is enabled high in level at the same time that the semiconductor device enters the self-refresh operation, and then remains enabled high in level for a predetermined period. The operation of the refresh detector 200 will hereinafter be described in more detail with reference to FIGS. 3 to 5.

In the refresh detector 200, as shown in FIG. 3, each of the first to fourth signal generators 201 to 204 generates the control signal refb<0>, refb<1>, refb<2> or refb<3> which is enabled when the corresponding bank performs the self-refresh operation or auto-refresh operation. Here, the first signal generator 201 is configured as shown in FIG. 4, and the second to fourth signal generators 202 to 204 are the same in configuration as the first signal generator 201. Also, one signal generator takes charge of one bank corresponding thereto. The operation of the first signal generator 201 will hereinafter be described in detail with reference to FIGS. 4 and 5.

Figure 5:
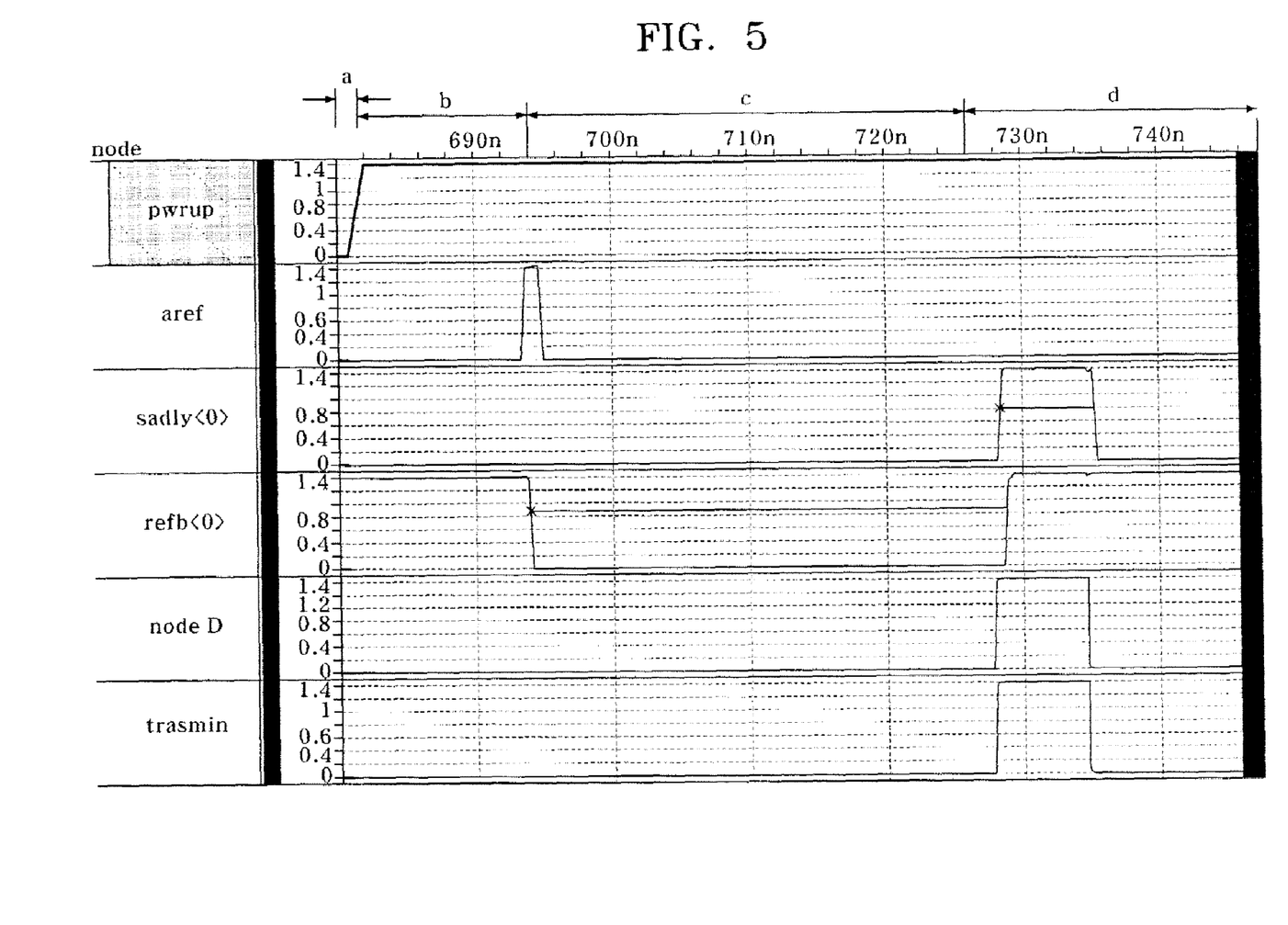
FIG. 5 is a timing diagram illustrating operation characteristics of the semiconductor device according to this embodiment.

First, in a period a of the timing diagram of FIG. 5, the initialization signal pwrup of the semiconductor device is low in level. As a result, the NOR gate NR41 outputs a low-level signal, thereby causing the PMOS transistor P41 to be turned on to pull the node A Up to high in level. The latch 301 holds this state of the node A and, at the same time, outputs a low-level signal to a node B. At this time, the auto-refresh signal aref remains disabled low in level.

The NOR gate NR42 NORs the low-level signal at the node B and the self-refresh signal sref. At this time, the self-refresh signal sref remains low in level, not activated yet, because it is activated in a self-refresh mode. As a result, the NOR gate NR42 receives the low-level signals at both input terminals thereof and thus outputs the control signal refb<0> which is high in level. Similarly, the second to fourth signal generators 202 to 204 output the control signals refb<1> to refb<3> which are high in level, respectively. Thus, the logic unit 210 ANDs the output signals from the first to fourth signal generators 201 to 204 and outputs a high-level signal as a result of the AND operation, so the control signal reflagb from the refresh detector 200 assumes a high level. Meanwhile, since the semiconductor device does not enter the auto-refresh operation yet, the RAS activation guarantee signal trasmin is low in level. As a result, a node C is high in level and a node D is low in level as shown in FIG. 5, so the precharge enable signal sadly<0> assumes a low level. Here, the RAS activation guarantee signal trasmin is enabled high in level at a point of time that a precharge operation is started, in order to guarantee a RAS activation time tRAS taken from entry into a row active state for the refresh operation until the start of the precharge operation. The precharge enable signal sadly<0> acts to enable the precharge operation upon completion of the refresh operation, namely, when the RAS activation time tRAS has elapsed.

Next, at the time that the initialization signal pwrup of the semiconductor device goes high in level as in a period b of the timing diagram of FIG. 5, the NOR gate NR41 receives two low-level signals and thus outputs a high-level signal, thereby causing the PMOS transistor P41 to be turned off. Because the auto-refresh operation is not performed yet, the auto-refresh signal aref remains disabled low in level. At this time, although the PMOS transistor P41 is turned off, the node A and node B are maintained at the previous levels by the operation of the latch 301. As a result, the control signal refb<0> remains high in level similarly to that in the period a. Then, the logic unit 210, which ANDs the output signals from the first to fourth signal generators 201 to 204, outputs a high-level signal continuously. Accordingly, in FIG. 2, because the control signal reflagb from the refresh detector 200 assumes a high level, the NAND gate ND22 outputs a low-level or high-level signal depending on the level of the output signal from the logic unit 100. In this case, the level of the RAS idle signal rasidle is determined depending on the levels of the row active signals rast12<0> to rast12<3>, each of which indicates whether the corresponding bank is in the active state.

Next, at the time that the auto-refresh signal aref is enabled high in level as in a period c of the timing diagram of FIG. 5, the NMOS transistor N41 is turned on to pull the node A down to low in level. The latch 301 holds this state of the node A and, at the same time, outputs a high-level signal to the node B. The NOR gate NR42 receives the high-level signal at the node B and thus outputs the control signal refb<0> which is low in level. Thus, the logic unit 210, which receives the output signal from the first signal generator 201 at one input terminal thereof, outputs a low-level signal irrespective of the output signals from the second to fourth signal generators 202 to 204, so the control signal reflagb from the refresh detector 200 assumes a low level. In FIG. 2, the NAND gate ND22 outputs a high-level signal irrespective of the output signal from the logic unit 100, because it receives the low-level control signal reflagb.

Hence, in the period c, the RAS idle signal rasidle is enabled high in level even though at least one bank is in the active state. In conclusion, in the present embodiment, even though each bank is in the active state, the RAS idle signal rasidle is enabled high in level in an auto-refresh mode where an actual operation, such as a read operation or write operation, is not performed. Therefore, it is possible to prevent unnecessary consumption of current in the semiconductor device.

Meanwhile, at this time, the RAS activation guarantee signal trasmin remains low in level, because the auto-refresh operation is still performed. As a result, the node C remains high in level and the node D remains low in level, so the precharge enable signal sadly<0> remains low in level.

Next, when the RAS activation time tRAS has elapsed after RAS activation is made, the RAS activation guarantee signal trasmin makes a low to high level transition as in a period d of the timing diagram of FIG. 5. As a result, the NAND gate ND42 NANDs a high-level signal from the NAND gate ND41 and the RAS activation guarantee signal trasmin and outputs a low-level signal as a result of the NAND operation, thereby causing the node C to go low in level and the node D to go high in level. Because the delay 303 is an inverting-delay device, although the node D becomes high in level, the delay 303 outputs the previous high-level signal for the predetermined delay time, and then a low-level signal after the lapse of the delay time.

Consequently, the precharge enable signal sadly<0> makes a low to high level transition when the node D becomes high in level, and makes a high to low level transition after the delay time elapses.

The NOR gate NR41 receives the precharge enable signal sadly<0>, changed to high in level in the above manner, and thus outputs a low-level signal, thereby causing the PMOS transistor P41 to be turned on to pull the node A up to high in level. The latch 301 holds this state of the node A and, at the same time, outputs a low-level signal to the node B. The NOR gate NR42 NORs the low-level signal at the node B and the self-refresh signal sref which is low in level and thus outputs the control signal refb<0> which is high in level. As a result, the first signal generator 201 outputs the high-level control signal refb<0> at the time that the semiconductor device enters the precharge operation after completing the auto-refresh operation. In the same manner, the second to fourth signal generators 202 to 204 also output the high-level control signals refb<1> to refb<3> after the completion of the auto-refresh operation.

Accordingly, in FIG. 3, the logic unit 210 ANDs the output signals from the first to fourth signal generators 201 to 204 and outputs a high-level signal as a result of the AND operation, so the control signal reflagb from the refresh detector 200 assumes a high level. Thus, in FIG. 2, because the control signal reflagb from the refresh detector 200 assumes the high level, the NAND gate ND22 outputs a low-level or high-level signal depending on the level of the output signal from the logic unit 100. Consequently, if the auto-refresh operation is completed, the level of the RAS idle signal rasidle is determined depending on the levels of the row active signals rast12<0> to rast12<3>, each of which indicates whether the corresponding bank is in the active state, similarly to that before the auto-refresh operation is performed.

As described above, in the semiconductor device according to the present embodiment, when the auto-refresh operation is performed even though the semiconductor device is in the active mode, the RAS idle signal is enabled high in level. Therefore, it is possible to reduce unnecessary current consumption of the semiconductor device so as to improve product performance and product yield in mass production.

On the other hand for suppression of unnecessary current consumption in the semiconductor device according to the present embodiment, the RAS idle signal rasidle is also enabled high in level in the self-refresh mode similarly to that in the auto-refresh mode, as will hereinafter be described in detail.

At the time that the semiconductor device enters the self-refresh mode in the state of the period b of FIG. 5, the self-refresh signal sref makes a low to high level transition. Then, in FIG. 4, the NOR gate NR42 outputs the control signal refb<0> of a low level in response to the self-refresh signal sref of the high level. As a result, the logic unit 210, which receives the output signal from the first signal generator 201 at one input terminal thereof, outputs a low-level signal irrespective of the output signals from the second to fourth signal generators 202 to 204, so the control signal reflagb from the refresh detector 200 assumes a low level. Hence, in the self-refresh operation, the RAS idle signal rasidle is enabled high in level even though at least one bank is in the active state. In conclusion, in the present embodiment, even though each bank is in the active state, the RAS idle signal rasidle is enabled high in level in the self-refresh mode where an actual operation, such as a read operation or write operation, is not performed. Therefore, it is possible to prevent unnecessary consumption of current in the semiconductor device.

Thereafter, when the RAS activation time tRAS has elapsed after the RAS activation is made, the RAS activation guarantee signal trasmin makes a low to high level transition. As a result, in the same manner as that stated previously, the precharge enable signal sadly<0> makes a low to high level transition, thereby allowing the precharge operation to be performed.

As described above, in the semiconductor device according to the present embodiment, when the auto-refresh or self-refresh operation is performed even though the semiconductor device is in the active mode, the RAS idle signal is enabled high in level. Therefore, it is possible to reduce unnecessary current consumption of the semiconductor device so as to improve product performance and product yield in mass production.

As apparent from the above description, a semiconductor device may provide for when a refresh operation is performed even though the semiconductor device is in an active mode, a RAS idle signal is enabled, thereby reducing unnecessary current consumption of the semiconductor device. According to the present invention, it is possible to improve product performance and product yield in mass production.

Figure 6:
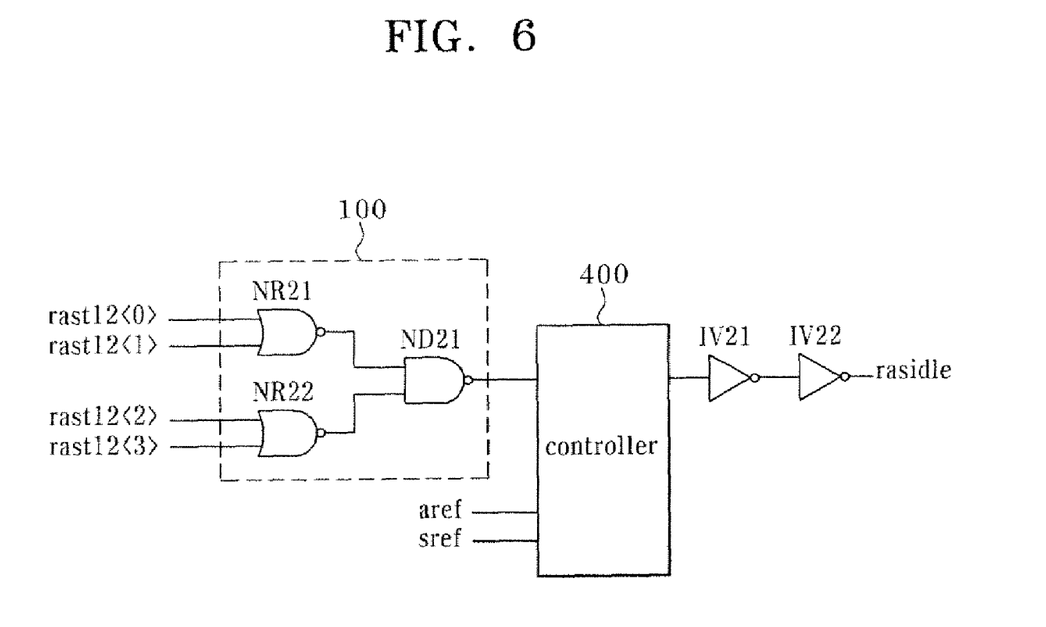
FIG. 6 is a circuit diagram showing the configuration of a semiconductor device that generates a RAS idle signal, according to another exemplary embodiment.

FIG. 6 is a circuit diagram showing the configuration of a semiconductor device that generates a RAS idle signal, according to another exemplary embodiment. As shown in FIG. 6, a controller 400 receives an auto-refresh signal aref, a self-refresh signal sref and the output signal from the logic unit 100, and outputs a RAS idle signal rasidle having information about activation of the semiconductor device in response to the auto-refresh signal aref and the self-refresh signal sref. The RAS idle signal rasidle is enabled when at least one of the banks performs the self-refresh operation or auto-refresh operation even though it is in the active state. The controller 400 may comprise the refresh detector 200 and the NAND gate ND22 in FIG. 2.

Although preferred embodiments have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device comprising:
   a first logic unit for performing a logic operation with respect to a plurality of first control signals, each of the first control signals indicating whether a corresponding one of a plurality of banks of the semiconductor device is in an active state;
   a controller for receiving an auto-refresh signal, a self-refresh signal and an output signal from the first logic unit, and outputting a second control signal having information about activation of the semiconductor device in response to the auto-refresh signal and the self-refresh signal;
   wherein the second control signal is enabled when all banks are in the standby state, the second control signal is disabled when at least one of the banks is in the active state, the second control signal is enabled when at least one of the banks performs the self-refresh operation or the auto-refresh operation even though it is in the active state, the semiconductor device thereby prevented from entering a command wait state under control of the second control signal.

2. The semiconductor device as set forth in claim 1, wherein the second control signal is a RAS idle signal.

3. The semiconductor device as set forth in claim 1, wherein the first logic unit performs an OR operation with respect to the first control signals.

4. The semiconductor device as set forth in claim 1, wherein the controller includes:
   a refresh detector for outputting a third control signal which is enabled when at least one of the banks performs the self-refresh operation or auto-refresh operation; and
   a second logic unit for performing a logic operation with respect to the output signal from the first logic unit and the third control signal and generating the second control signal.

5. The semiconductor device as set forth in claim 4, wherein the second logic unit activates and outputs the second control signal in response to inactivation of the output signal from the first logic unit or activation of the third control signal.

6. The semiconductor device as set forth in claim 5, wherein the second logic unit performs a NAND operation.

7. the semiconductor device as set forth in claim 5, wherein the refresh detector includes:
   a plurality of signal generators, each of the signal generators generating a corresponding fourth control signal which is enabled when the corresponding bank performs the self-refresh operation or auto-refresh operation; and
   a third logic unit for performing a logic operation with respect to the fourth control signals from the signal generators to output the third control signal.

8. The semiconductor device as set forth in claim 7, wherein each of the signal generators includes:
   a pull-up driver for pulling a first node up;
   a pull-down driver for pulling the first node down in response to the auto-refresh signal;
   a first latch for latching a signal at the first node for a predetermined period; and
   a fourth logic unit for performing a logic operation with respect to an output signal from the first latch and the self-refresh signal to output the corresponding fourth control signal.

9. The semiconductor device as set forth in claim 8, wherein the first latch is an inverting latch and the fourth logic unit performs a NOR operation.

10. The semiconductor device as set forth in claim 8, wherein each of the signal generators further includes:
   a buffer for buffering an initialization signal; and
   a logic element for performing a logic operation with respect to an output signal from the buffer and a precharge enable signal and supplying the resulting signal to a control gate of the pull-up driver.

11. The semiconductor device as set forth in claim 10, wherein the logic element performs a NOR operation.

12. The semiconductor device as set forth in claim 8, wherein each of the signal generators further includes:
   a second latch for receiving the corresponding, fourth control signal and a RAS activation guarantee signal, the second latch including first and second logic elements interconnected in each form;
   a first buffer for buffering an output signal from the second latch;
   a delay for delaying an output signal from the first buffer by a predetermined delay time; and
   a fifth logic unit for performing a logic operation with respect to the output signal from the first buffer and an output signal from the delay to output a precharge enable signal.

13. The semiconductor device as set forth in claim 12, wherein the first and second logic elements of the second latch are NAND gates.

14. The semiconductor device as set forth in claim 12, wherein the fifth logic unit performs an AND operation.

15. The semiconductor device as set forth in claim 12, wherein each of the signal generators further includes:
   a second buffer for buffering an initialization signal; and
   a third logic element for performing a logic operation with respect to an output signal from the second buffer and the precharge enable signal and supplying the resulting signal to a control gate of the pull-up driver.

16. The semiconductor device as set forth in claim 15, wherein the third logic element performs a NOR operation.

17. The semiconductor device as set forth in claim 7, wherein each of the fourth control signals is enabled low in level and the third logic unit performs an AND operation.

18. The semiconductor device as set forth in claim 17, wherein the third logic unit includes:
   a plurality of NAND gates, each of the NAND gates performing a NAND operation with respect to corresponding two of the fourth control signals; and
   a NOR gate for performing a NOR operation with respect to output signals from the NAND gates.

19. The semiconductor device as set forth in claim 1, wherein each of the first control signals is a row active signal.

* * * * *